United States Patent
Versen et al.

(10) Patent No.: US 7,203,106 B2
(45) Date of Patent: Apr. 10, 2007

(54) INTEGRATED SEMICONDUCTOR MEMORY WITH REDUNDANT MEMORY CELLS

(75) Inventors: Martin Versen, München (DE); Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/189,018

(22) Filed: Jul. 26, 2005

(65) Prior Publication Data

US 2006/0023556 A1 Feb. 2, 2006

(30) Foreign Application Priority Data

Jul. 28, 2004 (DE) .................. 10 2004 036 545

(51) Int. Cl.
*G11C 7/00* (2006.01)

(52) U.S. Cl. ....................................... 365/200; 365/201

(58) Field of Classification Search ................ 365/200, 365/225.7, 201, 230.03, 185.09, 185.11
See application file for complete search history.

(56) References Cited

U.S. PATENT DOCUMENTS

| | | | |
|---|---|---|---|
| 5,297,086 A * | 3/1994 | Nasu et al. ................. | 365/200 |
| 6,108,253 A * | 8/2000 | Ohta ........................... | 365/200 |
| 6,426,911 B1 | 7/2002 | Lehmann et al. | |
| 6,442,084 B2 | 8/2002 | Keeth | |
| 6,473,872 B1 | 10/2002 | Hoffman | |
| 6,564,346 B1 | 5/2003 | Vollrath et al. | |
| 6,725,403 B1 | 4/2004 | Schmoelz | |
| 6,757,204 B2 * | 6/2004 | Di Ronza et al. ........... | 365/200 |
| 6,804,156 B2 * | 10/2004 | Ito .............................. | 365/200 |
| 7,075,836 B2 * | 7/2006 | Maki .......................... | 365/200 |
| 2004/0001375 A1 | 1/2004 | Beer | |

\* cited by examiner

*Primary Examiner*—Trong Phan
(74) *Attorney, Agent, or Firm*—Edell, Shapiro & Finnan, LLC

(57) ABSTRACT

An integrated semiconductor memory has regular row and column lines, which can be replaced with redundant row and column lines in the event of a fault. Following initialization of the memory cells with an initialization data item, a data generator circuit writes an identification data item to the memory cells along a regular row or column line. A faulty regular row or column line is replaced with the associated redundant row or column line. Next, the initialization data item is written to memory cells along sound regular row or column lines and the respective identification data item is written to the memory cells along a faulty regular row or column line. Faulty regular row or column lines have the same data value in their memory cells as the redundant row or column lines replacing them.

25 Claims, 5 Drawing Sheets

INTEGRATED SEMICONDUCTOR MEMORY WITH REDUNDANT MEMORY CELLS

CROSS REFERENCE TO RELATED APPLICATIONS

This application claims priority under 35 USC §119 to German Application No. DE 10 2004 036 545.8, filed on Jul. 28, 2004, and titled "Integrated Semiconductor Memory Containing Redundant Memory Cells," the entire contents of which are hereby incorporated by reference.

FIELD OF THE INVENTION

The present invention relates to an integrated semiconductor memory containing redundant memory cells.

BACKGROUND

Integrated semiconductor memories, for example, DRAM (Dynamic Random Access Memory) semiconductor memories, generally contain a plurality of memory cell arrays or memory banks which contain memory cells arranged in matrix form. FIG. 1 shows, for example, four memory cell arrays or memory banks B1, B2, B3, B4 arranged on a semiconductor memory module M. To improve the yield, integrated semiconductor memories are equipped with redundancy during production. A memory bank equipped in this manner has both regular memory cells and redundant memory cells. For example, the memory bank B3 has a first area of the memory cell array 10a, where regular memory cells are arranged, and a second area 10b, 10c, where redundant memory cells are arranged.

FIG. 2 shows an enlarged detail from the memory bank B3. The first regular memory area 10a and the second redundant memory areas 10b, 10c have memory cells SZ arranged along row lines R1, R2, R3 and column lines S1, S2, S3 in matrix form. The memory cells may be DRAM memory cells, for example. As an example of this, FIG. 2 shows the structure of a DRAM memory cell SZ arranged along the row line R3 and the column line S1. The DRAM memory cell SZ have a selection transistor AT, which can be controlled by a control signal on the row line R3, and a storage capacitor SC, which can be connected to the column line S1 via the selection transistor AT.

If faulty memory cells arise during the production process, a redundancy analysis uses the identified faults and the available sound redundancy to ascertain whether it is possible to repair the semiconductor memory. In this case, a faulty row line in the regular memory cell array 10a, to which line at least one faulty memory cell is connected, is replaced with a redundant row line in the redundant memory area 10b of the memory cell array. It is likewise possible for a column line in the regular memory area 10a of the memory cell array, to which line at least one faulty memory cell is connected, to be replaced with a column line 10c in the redundant area of the memory cell array.

FIG. 3A shows an example of a faulty row line R in the first memory area 10a. The line is able to be addressed using an address x=7 and replaced with a sound redundant row line Rr with the address xr=2. FIG. 3B shows a faulty column line S, which can be activated using the address y=7 and replaced during the redundancy analysis with a sound column line Sr, which can be activated using the address yr=2, in the redundant memory area 10c.

There are numerous examples for the implementation of an efficient redundancy analysis. For example, an integrated semiconductor memory with regular and redundant word lines where each are divided into individual line segments is known. If a memory cell connected to one of the segments is faulty, then the regular word line segment in question is replaced with a redundant word line segment. By replacing respective individual portions of a regular word line, it is possible to make efficient use of the redundant word lines, whose availability is limited.

An integrated semiconductor memory with a redundancy control unit which can store addresses for faulty memory cells is also known. If the occurrence of a faulty memory cell is detected during the production of the integrated semiconductor memory, the memory cell's address is supplied to the redundancy control unit, where the memory cell's address is compared with already stored addresses for faulty memory cells. If the address of the faulty memory cell does not match any of the addresses already stored, a new faulty memory cell has appeared during production. At the end of the manufacturing process, it is possible to establish whether it is still possible to repair the integrated semiconductor memory due to the number of faults uncovered.

Information about the use of a redundant line is generally indicated by the status of laser fuses or electrical fuses. A circuit for programming electrical fuses including a bit generator that supplies individual control bits to a shift register is known. A line for generating a programming voltage is activated by a program data stream. The fuses are connected to the individual registers in the shift register and to the programming line, and are programmed based on the state of the register connected to the fuses and the data stream on the programming line.

An integrated circuit for decoding address signals that can be used for addressing redundant word lines, in particular, is known. The circuit uses a first decoder to decode a row address and to generate a first address signal for addressing word lines in a first half of a memory bank and a second decoder to decode the row address in combination with data indicating the status of fuses in order to generate a second address signal for addressing word lines in a second half of the memory bank. The first and second address signals simultaneously select first and second word lines in the first and second halves of the memory bank. The row address can be used to select one of the redundant word lines, which replaces a faulty one of the first and second word lines.

A method for compressing a "bit fail map," which has information relating to a fault analysis, is known. Fault information is indicated in marked areas of the bitmap. The fault classification can be formed using the shape and dimension of the fault areas in the marked areas of the bit map. The use of a compressed bitmap greatly reduces the memory requirement for storing the fault information.

During operation of the integrated semiconductor memory, if a faulty row line or column line in the regular memory area is addressed or detected, the associated redundant row line or column line in the redundant memory area is activated instead of the faulty row and column line. The associated requisite readdressing of a regular row and column line with a redundant row and column line is burnt permanently into a fuse circuit using a "laser fuse process." After the laser fuse process, the memory chip is operational. The regular cell array has been repaired by replacing faulty row and column lines in the regular area of its memory cell array with sound redundant row and column lines in the redundant area of the memory cell array.

To test the integrated semiconductor memory, a special test mode makes it possible to turn the redundancy addressing on or off. For example, it is possible to establish whether a regular memory cell has been replaced with a redundant memory cell. The special test mode turns on the redundancy addressing at the beginning. Next, a logic 0 is written to the memory with redundancy, for example. Because the redundancy is turned on, this prompts a faulty memory cell in the regular memory area to be replaced with a redundant memory cell in the redundant memory area. Next, a further test mode turns off the redundancy addressing again, so that externally applied addresses are used to address only memory cells in a regular memory area, regardless of whether these cells are sound or faulty. A logic 1 is written to the memory cells in the regular memory cell array. To read the content of the memory cells in the regular and redundant areas, the redundancy addressing is then turned on again. Redundant memory cells in which a logic 0 was stored, while the redundancy addressing was turned on and were then no longer addressed upon transfer to the logic 1, will fail upon being read during the assessment for logic 1. The address applied in this case is thus used to address a cell from the redundancy, not the associated regular memory cell.

Although such a test method makes it possible to establish whether a regular memory cell has been replaced with a redundant memory cell or whether an addressed row line or column line in a regular memory cell array has been replaced with a redundant row line or column line, it is a very complex matter or even impossible to establish which of the redundant row lines in the second memory area is replacing which regular row line in the first memory area or which redundant column line in the second memory area has which regular column line in the first memory area associated with it (redundancy scrambling).

Precise evaluation of the redundancy scrambling is currently possible only by opening the memory chip to decrypt the laser fuse code which has been burnt. However, when the chip is opened, the use of selective etching methods often results in corrosion of the unprotected laser fuses, so that the redundancy scrambling information which is burnt in is lost during the actual preparation.

Particularly, with the use of E-fuses, it is important to ascertain the redundancy scrambling without complex preparation steps or opening the component. In contrast to the evaluation of laser fuses, when analyzing the E-fuses, a further difficulty arises because their state cannot immediately be seen from them. In addition, the E-fuses are generally buried in deeper layers and are protected against corrosion, which means that complex preparation steps are required in order to analyze them.

An integrated semiconductor memory with redundant memory cells and a method, which provides a simplest way of establishing which faulty row and column line in the regular memory cell array has been replaced with which sound row and column line in the redundant area of the memory cell array, are desirable.

SUMMARY

According to the present invention, an integrated semiconductor memory includes a memory cell array with memory cells arranged in first and second memory areas of the memory cell array along row and column lines. The row and column lines in the first and second memory areas of the memory cell array can each be addressed using an address for read and write access to the memory cells arranged along the row and column lines. In addition, a faulty row and column line in a first memory area can be replaced with a sound row and column line in the second memory area. The integrated semiconductor memory also has an addressing circuit for addressing the row and column lines in the first and second memory areas. Additionally, the integrated semiconductor memory includes a data generator circuit with an output connection for generating data with data values. The data generator circuit is connected to the memory cell array by the output connection in order to store the data generated by the data generator circuit in the memory cells of the memory cell array. The addressing circuit either addresses one of the row and column lines in the first memory area and the second memory area, or, upon detection of one of the faulty row and column lines in the first memory area, addresses the one of the sound row and column lines replacing the one of the faulty row and column lines in the first memory area in the second memory area. The data generator circuit generates an initialization data item in order to initialize the memory cells in the first and second memory areas. In addition, the data generator circuit generates identification data in order to identify the row and column lines. Furthermore, the integrated semiconductor memory has an evaluation circuit for generating an output data item. The evaluation circuit can connect to the memory cell array in order to receive the data stored in the memory cells of the memory cell array. In this case, the evaluation circuit takes the data, supplied from the memory cell array, from the addressed row and column lines in the first and second memory areas and generates the output data item with the data value stored most often in the memory cells arranged along the addressed row and column lines.

In one aspect, the integrated semiconductor memory includes a control circuit for generating control signals in order to control the data generator circuit and the addressing circuit. In this case, the data generator circuit, for example, generates the initialization data item upon actuation by the control circuit using a first control signal.

In one embodiment of the integrated semiconductor memory, the data generator circuit has a first input connection for applying the address of one of the row and column lines and a second input connection for applying the data stored in the memory cells. The data generator circuit generates the initialization data item with one of the data values that differs from the addresses of the row and column lines. In addition, upon actuation by the control circuit using a second control signal, the data generator circuit generates a respective identification data item from the identification data, if the address, supplied via the first input connection, of one of the row and column lines is different than the data value, supplied via the second input connection, of the data stored in the memory cells.

In another embodiment of the integrated semiconductor memory, the data generator circuit generates the identification data item with one of the data values that matches the addresses of the row and column lines. Upon actuation by the control circuit using the second control signal, the data generator circuit generates the initialization data item, if the address, supplied via the first input connection, of one of the row and column lines matches the data value, supplied via the second input connection, of the data stored in the memory cells.

In a further embodiment of the integrated semiconductor memory, the data generator circuit includes a first memory unit for storing the addresses of the row and column lines and a second memory unit for storing the data value of the data stored in the memory cells. In addition, the data generator circuit includes a combinational logic circuit with a first input connection for applying the data value of the data stored in the memory cells and a second input connection for applying one of the addresses of the row and column lines. The first memory unit is connected to the first input connection of the data generator circuit, and the second memory unit is connected to the second input connection of the data generator circuit. The combinational logic circuit is connected by a first input connection to the first memory unit and by a second input connection to the second memory unit.

In one embodiment, the combinational logic circuit is an EXOR gate.

In another aspect of the integrated semiconductor memory, the data generator circuit includes a data generator for generating the initialization data item.

Further, the data generator circuit includes a controllable switch, which connects the combinational logic circuit to the output connection of the data generator circuit. Similarly, the data generator is connected to the output connection of the data generator circuit by the controllable switch. Upon actuation of the data generator circuit by the control circuit using the first control signal, the controllable switch in the data generator circuit is designed to connect the data generator to the output connection of the data generator circuit, and upon actuation of the data generator circuit by the control circuit using the second control signal, the combinational logic circuit is connected to the output connection of the data generator circuit.

In a further embodiment of the integrated semiconductor memory, upon actuation by the control circuit using a third control signal, the addressing circuit addresses one of the row lines in the first memory area.

In another embodiment, upon actuation by the control circuit using a fourth control signal, the addressing circuit addresses one of the row lines in the second memory area.

In a further embodiment of the integrated semiconductor memory, upon actuation using a fifth control signal, the addressing circuit addresses one of the row lines in the first memory area of the memory cell array, if the one of the row lines in the first memory area is sound. In addition, upon actuation using a fifth control signal, the addressing circuit addresses the one of the sound row lines in the second memory area replacing the one of the faulty row lines in the first memory area.

In a further implementation, upon actuation by the control circuit using a sixth control signal, the addressing circuit addresses the one of the column lines in the first memory area.

In line with a further embodiment, upon actuation by the control circuit using a seventh control signal, the addressing circuit addresses the one of the column lines in the second memory area.

In another aspect of the integrated semiconductor memory, upon actuation using an eighth control signal, the addressing circuit addresses the one of the column lines in the first memory area, if the one of the column lines in the first memory area is sound. In addition, upon actuation using an eighth control signal, the addressing circuit addresses the one of the sound column lines in the second memory area replacing the one of the faulty column lines in the first memory area.

In one implementation of the integrated semiconductor memory, the addressing circuit includes an evaluation circuit, an address generator for generating the addresses of the row and column lines, and a memory unit. The address generator and the memory unit are connected to the evaluation circuit. The memory unit stores the address of the one of the faulty row and column lines in the first memory area and the address of the one of the row and column lines in the second memory area replacing the one of the faulty row and column lines in the first memory area. The address generator generates the address of one of the row and column lines in the first memory area and the second memory area. The evaluation circuit compares the address, supplied by the address generator, of one of the row and column lines in the first memory area with the address, stored in the memory unit, of the faulty row and column lines in the first memory area and generates the address stored in the memory unit of the sound row and column lines in the second memory area replacing the one of the faulty row and column lines in the first memory area.

A method for testing an integrated semiconductor memory with redundant memory cells includes providing an integrated semiconductor memory having memory cells arranged along row lines in a first memory area of the memory cell array and memory cells which are arranged along row lines in a second memory area of the memory cell array. To effect read and write access to the memory cells arranged along one of the row lines, the one of the row lines in the first and second memory areas are addressed using an address. A faulty row line in the first memory area can be replaced with a sound row line in the second memory area by addressing the sound row line in the second memory area, instead of the faulty row line in the first memory area. The row lines in the first memory area and the second memory area are addressed in succession. An initialization data item is written to the memory cells arranged along the addressed row line in the first memory area and the second memory area. Next, the row lines in the first memory area are respectively addressed in succession and an identification data item is written to the memory cells arranged along the addressed row line in the first memory area, if the addressed row line in the first memory area is sound. If, on the other hand, the addressed row line in the first memory area is faulty, one of the sound row lines in the second memory area is respectively addressed and the identification data item is written to the memory cells which are arranged along the addressed sound row line in the second memory area. Next, the row lines in the first memory area are respectively addressed in succession and the initialization data item is respectively written to the memory cells arranged along the addressed row line in the first memory area, if the addressed row line in the first memory area is sound. If, on the other hand, the addressed row line in the first memory area is faulty, the identification data item is respectively written to the memory cells arranged along the addressed row line in the first memory area. Next, the row lines in the first memory area are respectively addressed in succession and the data stored in the memory cells arranged along the addressed row line are respectively read. Upon each addressing operation for one of the row lines in the first memory area, the data item written most often to the memory cells arranged along the addressed row line in the first memory area is output. Next, the row lines in the second memory area are respectively addressed in succession and the data stored in the memory cells arranged along the addressed row line in the second memory area are read. Upon each addressing operation for one of the row lines in the second memory area, the data item written most often to the memory cells arranged along the addressed row line in the second memory area is output.

Additionally, the method includes providing an integrated semiconductor memory with memory cells arranged along column lines in a first memory area of the memory cell array and memory cells arranged along column lines in a second memory area of the memory cell array. To effect read and write access to the memory cells arranged along one of the column lines, the one of the column lines in the first and second memory areas can be addressed using an address. In addition, a faulty column line in the first memory area can be replaced with a sound column line in the second memory area addressing the sound column line in the second memory area, instead of the faulty column line in the first memory area. The column lines in the first memory area and the second memory area are respectively addressed in succession and an initialization data item is written to the memory cells arranged along the addressed column line in the first memory area and the second memory area. Next, the column lines in the first memory area are respectively addressed in succession and an identification data item is written to the memory cells arranged along the addressed column line in the first memory area, when the addressed column line in the first memory area is sound. When the addressed column line in the first memory area is faulty, however, one of the sound column lines in the second memory area is respectively addressed and the identification data item is written to the memory cells arranged along the addressed sound column line in the second memory area. Next, the column lines in the first memory area are respectively addressed in succession and the initialization data item is written to the memory cells arranged along the addressed column line in the first memory area, when the addressed column line in the first memory area is sound. When the addressed column line in the first memory area is faulty, however, the identification data item is respectively written to the memory cells arranged along the addressed column line in the first memory area. Next, the column lines in the first memory area are respectively addressed and the data stored in the memory cells arranged along the addressed column line are read. Upon each addressing operation for one of the column lines in the first memory area, the data item written most often to the memory cells arranged along the addressed column line in the first memory area is output. Next, the column lines in the second memory area are respectively addressed and the data stored in the memory cells arranged along the addressed column line in the second memory area are respectively read. Upon each addressing operation for one of the column lines in the second memory area, the data item written most often to the memory cells arranged along the addressed column line in the second memory area is output.

BRIEF DESCRIPTION OF THE DRAWINGS

The invention is explained in more detail below with reference to figures which show exemplary embodiments of the invention and in which.

DETAILED DESCRIPTION

Figure 1:
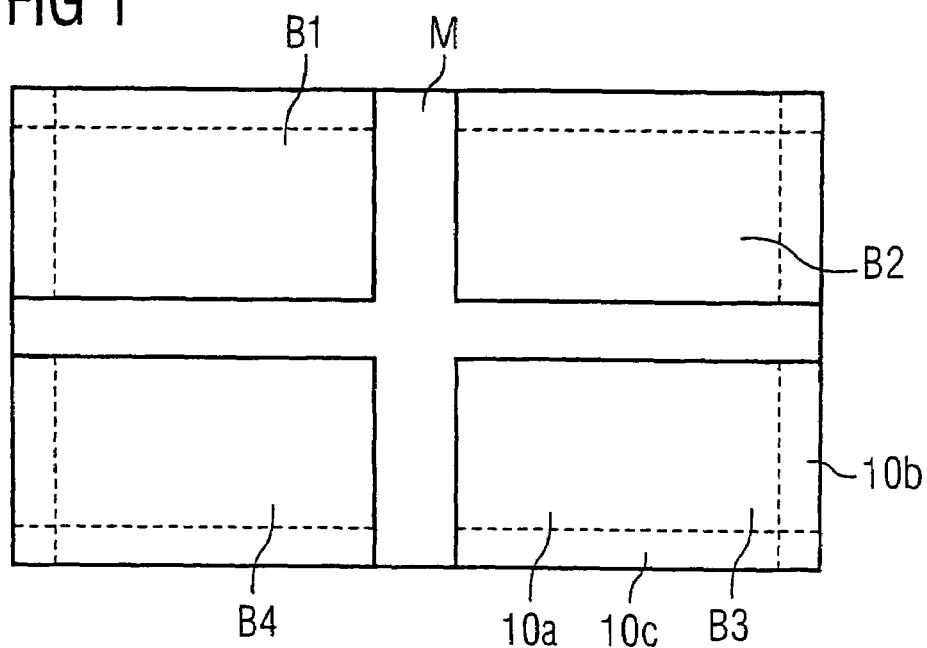
FIG. 1 shows a memory module divided into memory banks.
Figure 2:
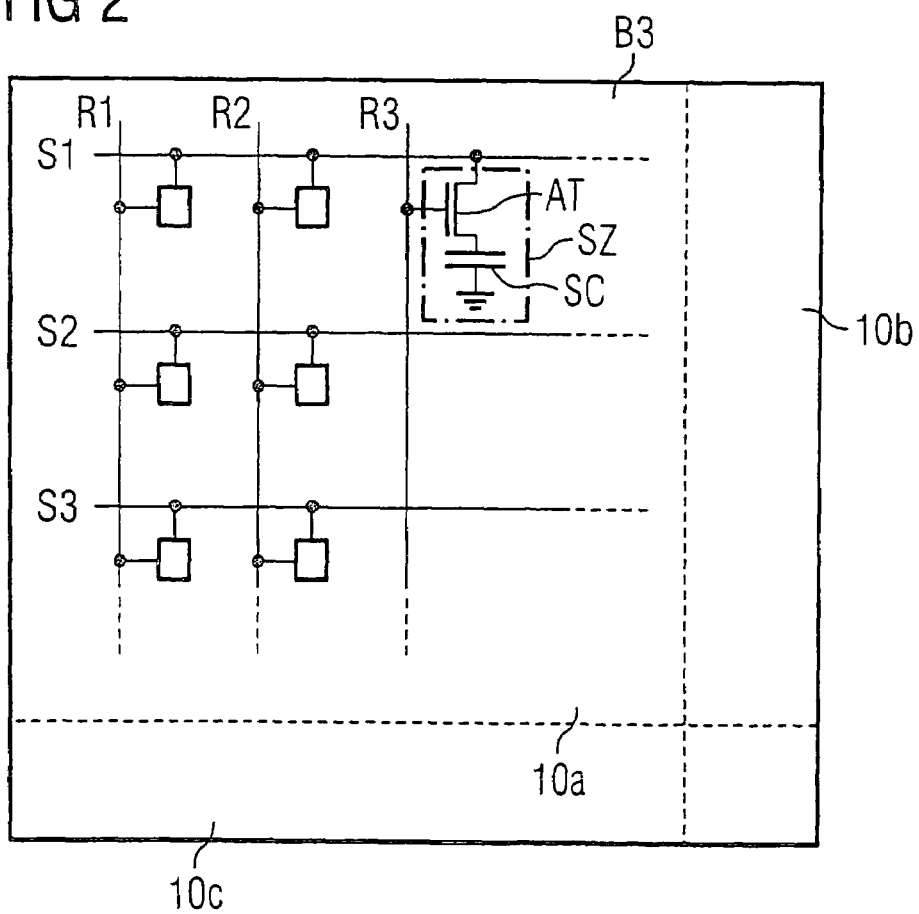
FIG. 2 shows a memory cell array with a regular and a redundant memory area.
Figure 3A:
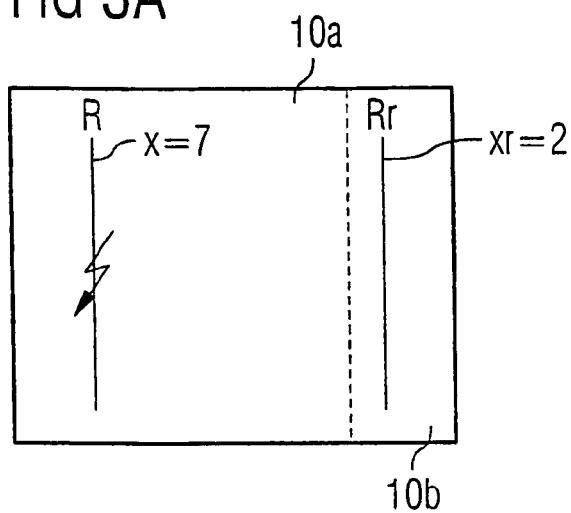
FIG. 3a shows a memory cell array with a faulty regular row line and a redundant row line.
Figure 3B:
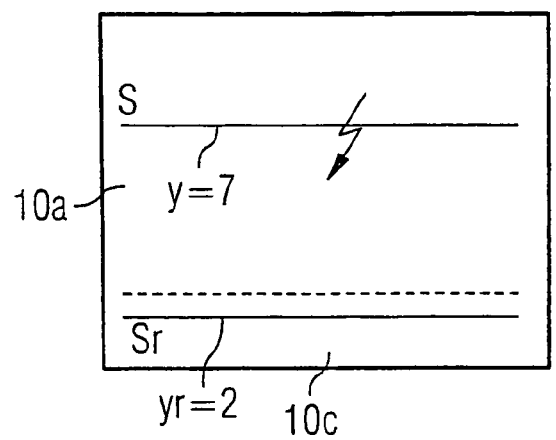
FIG. 3b shows a memory cell array with a faulty regular column line and a redundant column line.
Figure 4:
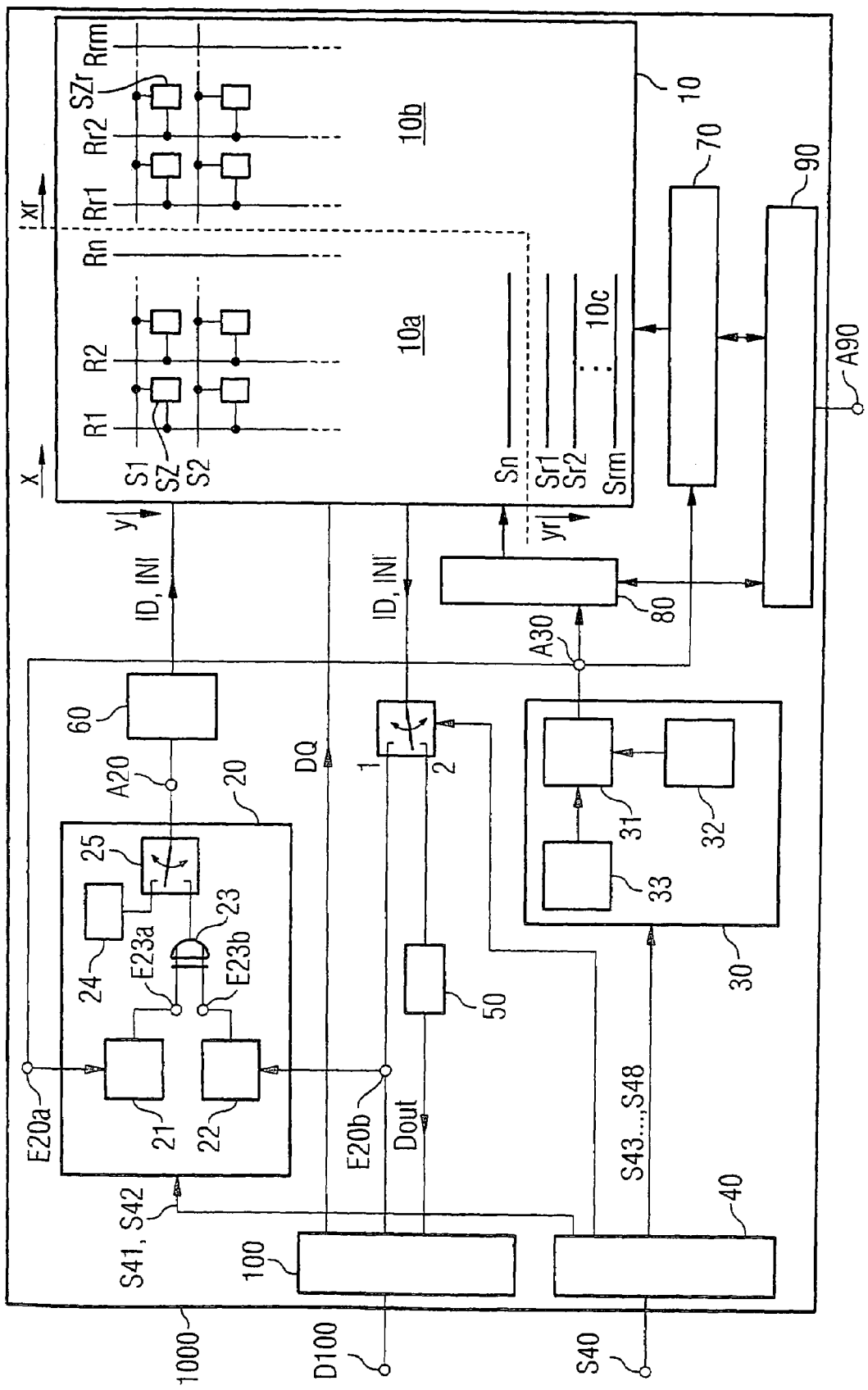
FIG. 4 shows an embodiment of an integrated semiconductor memory for analyzing a redundancy scrambling in line with the invention.

FIG. 4 shows an integrated semiconductor memory 1000 with a memory cell array 10 divided into a first memory area 10a with regular memory cells SZ and into a second memory area 10b, 10c containing redundant memory cells SZr. The first and second memory areas have the memory cells SZ, SZr arranged respectively along row lines R1, R2, ..., Rn, Rr1, Rr2, ..., Rrm and column lines S1, S2, ..., Sn, Sr1, Sr2, ..., Srm. If a regular memory cell SZ arranged along a row line, for example, the row line R1, in the first area 10a of the memory cell array is faulty, the row line R1 is replaced with a redundant row line, for example, the redundant row line Rr1, in the second area 10b of the memory cell array. Similarly, a faulty memory cell arranged along a column line, for example, the column line S1, in the first area of the memory cell array can be replaced with a redundant memory cell in the second area 10c of the memory cell array. The redundant memory cell is arranged along a redundant column line, for example, the redundant column line Sr1. The regular row lines in the first area 10a of the memory cell array can be activated using addresses x, and the regular column lines are activated using addresses y. In addition, the redundant row lines in the second area 10b of the memory cell array can be activated using addresses xr, and the redundant column lines in the second area 10c of the memory cell array can be activated using addresses yr.

In addition, the integrated semiconductor memory 1000 has a data generator circuit 20 for generating data ID, INI (i.e., identification data and/or initialization data) connected to the memory cell array 10 via an output connection A20 and an output buffer 60 for buffer-storing the data generated by the data generator. The data generator circuit 20 has a first memory unit 21 for storing the addresses x, xr, y and yr of the column and row lines R, Rr, S, Sr in the first and second memory areas. In addition, the data generator circuit includes a second memory unit 22 for storing a data value for data ID, INI, which can be stored in the memory cells SZ, SZr of the memory cell array 10. The first and second memory units are connected to input connections E23a, E23b of an EXOR gate 23. The output of the EXOR gate 23 can be connected to the output connection A20 of the data generator circuit 20 by a controllable switch 25. The data generator circuit 20 also has a data generator 24, which can likewise be connected to the output connection A20 of the data generator circuit 20 by the controllable switch 25.

The integrated semiconductor memory also includes a control circuit 40 for generating internal control signals S41, ..., S48. The control signals are generated based on external control signals applied to a control input S40 of the control circuit.

The control circuit 40 supplies the data generator circuit 20 with a first control signal S41 and with a second control signal S42. Upon actuation of the data generator circuit 20 using the first control signal S41, the data generator 24 is connected to the output connection A20 of the data generator circuit 20 by the controllable switch 25. Upon actuation of the data generator circuit 20 using the second control signal S42, the EXOR gate 23 has its output connected to the output connection A20 of the data generator circuit 20 by the controllable switch 25.

In addition, the control circuit 40 generates a third control signal S43, a fourth control signal S44, a fifth control signal S45, a sixth control S46, a seventh control signal S47, and an eighth control signal S48, which are supplied to an addressing circuit 30. The addressing circuit 30 includes an evaluation circuit 31, an address generator 32, and a memory unit 33. The address generator 32 generates the addresses x, y of the row and column lines R, S in the first area 10a of the memory cell array and the addresses xr, yr of the redundant row and column lines Rr, Sr in the second area 10b, 10c of the memory cell array. The memory unit 33 can store the addresses x and y of regular faulty row and column lines R and S in the first memory area and the associated addresses xr and yr of the redundant sound row and column lines Rr and Sr replacing the faulty row and column lines in the second memory area.

Upon actuation of the addressing circuit 30 by the control circuit 40 using the third control signal S43, the address generator 32 generates one of the addresses x of one of the row lines R in the first regular area 10a of the memory cell array 10 and supplies the address to an output connection A30 of the addressing circuit 30. Upon actuation of the addressing circuit 30 using the fourth control signal S44, the address generator 32 generates the address xr of one of the redundant row lines Rr in the second area of the memory cell array 10b and supplies the address to the output connection A30 of the addressing circuit 30. Upon actuation of the addressing circuit 30 using the fifth control signal S45, the address generator 32 generates the address x of one of the row lines R in the first area of the memory cell array and supplies the address to the evaluation circuit 31. The evaluation circuit 31 compares the address x supplied for the regular row line R with the addresses of the faulty row lines stored in the memory unit 33. If a match is detected, at the output connection A30, the evaluation circuit 31 generates the address stored in the memory unit 33 for the redundant row line Rr replacing the faulty row line R. If the address of one of the regular row lines generated by the address generator 32 is different than the addresses of the faulty row lines stored in the memory unit 33, at the output connection A30, the evaluation circuit 31 generates the address x of the regular row line generated by the address generator 32.

Upon actuation of the addressing circuit 30 using the sixth control signal S46, the address generator 32 generates the address y of one of the regular column lines S in the first area 10a of the memory cell array 10 and supplies the address to the output connection A30 of the addressing circuit 30. Upon actuation of the addressing circuit 30 using the seventh control signal S47, the address generator 32 generates the address yr of a redundant column line Sr in the second area 10c of the memory cell array 10 and supplies the address to the output connection A30. Upon actuation of the addressing circuit 30 using the eighth control signal S48, the address generator 32 generates the address y of one of the regular column lines S in the first area 10a of the memory cell array 10 and supplies the address to the evaluation circuit 31. The evaluation circuit 31 compares the address y supplied for the regular column line S with the addresses of the faulty regular column lines stored in the memory unit 33. If the address of the regular column line generated by the address generator matches one of the addresses of a faulty column line stored in the memory unit 33, at the output connection A30, the evaluation circuit 31 generates the address yr of the redundant column line Sr replacing the faulty regular column line S. If the address generated by the address generator 32 for one of the regular column lines is different than the addresses of the faulty column lines stored in the memory unit 33, at the output connection A30, the evaluation circuit 31 generates the address y of the regular column line generated by the address generator 32.

The addresses x, xr, y, yr generated by the addressing circuit 30 are supplied via the output connection A30 to the first input connection E20a of the data generator circuit 20 and thus to the first memory unit 21.

To address or activate one of the row and column lines in the first and second areas of the memory cell array for access, for example, write and read access, to memory cells arranged along the addressed row and column line, the output connection A30 of the addressing circuit 30 is connected to a row decoder 70 and a column decoder 80. To address or activate a row and column line of the memory cell array 10 externally, the integrated semiconductor memory 1000 has an address register 90 whose input can be supplied with address signals via an address connection A90. The address register 90 is connected to the row decoder 70 and the column decoder 80.

To write and read a data item to and from the memory cell array 10, the integrated semiconductor memory 1000 has an input and output buffer 100 connected to a data connection D100 for writing and reading data.

To read data ID, INI from the memory cells, the memory cell array 10 is connected to the data input and output buffer 100 by a controllable switch 110 in a first switch position. In the first switch position, the data ID, INI stored in the memory cell array are also supplied via the second input connection E20b to the second memory unit 22 in the data generator circuit 20. Using a second switch position of the controllable switch 110, the data ID, INI from the memory cell array 10 are supplied to an evaluation circuit 50 connected to the data input and output buffer 100. The controllable switch 110 can be controlled by the control circuit 40.

Figure 5:
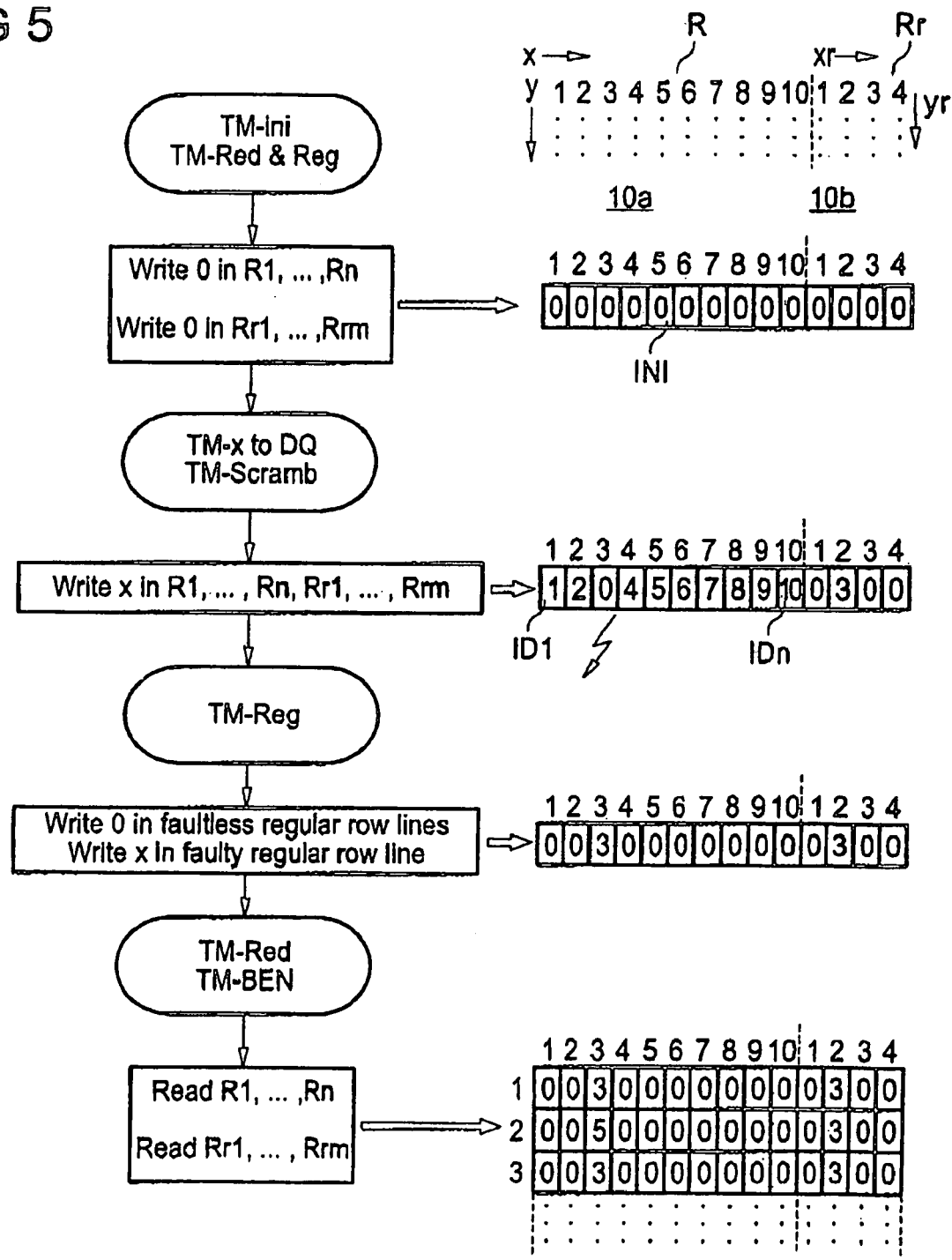
FIG. 5 shows a first embodiment of a method for ascertaining the redundancy scrambling in line with the invention.

The left-hand side of FIG. 5 shows a signal flowchart for a method for ascertaining a redundancy scrambling in which faulty row lines are replaced with redundant row lines. The right-hand side of FIG. 5 shows the respective state of the memory cell array corresponding to steps in the flowchart. The regular memory cells in the first area 10a of the memory cell array can be addressed using the addresses x and y. In the example in FIG. 5, the first memory area 10a includes ten row lines R1, R2, R10. The redundant area 10b includes four redundant row lines Rr1, . . . , Rr4. The redundant memory cells in the memory area 10b can be addressed using the addresses xr, yr.

At the start of the test method, an external control signal "TM-ini" and an external control signal "TM-Reg & Red" are applied to the control connection S40 of the control circuit 40. This signal combination prompts initialization of the memory cells along the row lines R1, . . . , R10 in the regular memory area 10a and the row lines Rr1, . . . , Rr4 in the redundant memory area 10b. To initialize the memory cells, the control circuit 40 actuates the data generator circuit 20 using the first control signal S41 and actuates the addressing circuit 30 using the third control signal S43. As a result, the data generator 24 is connected to the output connection A20 of the data generator circuit 20 by the controllable switch 25. Whenever the data generator circuit 20 is actuated using the first control signal S41, the data generator 24 generates an initialization data item NI, for example, with the logic data value 0. Whenever the addressing circuit 30 is actuated using the third control signal S43, the address generator 32 generates one of the addresses x of the row lines R1, R2, . . . , Rn in the first memory area 10a of the memory cell array, and these row lines are therefore activated to write the initialization data item to the memory cells SZ. As a result, the logic data value 0 is stored in the memory cells connected along the row lines R1, R2, . . . , Rn in the regular area 10a. When the regular area 10a has been initialized, the control circuit 40 generates the fourth control signal S44. Whenever the addressing circuit 30 is actuated using the fourth control signal S44, the address generator 32 generates an address for one of the row lines Rr1, . . . , Rr4 from the redundant row lines in the second memory area 10b. As a result, the logic data value 0 is written to all redundant memory cells SZr arranged along the redundant row lines Rr1, . . . , Rr4. FIG. 5 shows the memory cells of the first column line in the regular and redundant areas for the sake of simplicity.

When the entire memory area has been initialized, an external control signal "TM-xtoDQ" and an external control signal "TM-Scramb" are applied to the control connection S40. The external control signal "TM-xtoDQ" prompts the writing of a characteristic identification data item to the memory cells respectively arranged along a row line. The external control signal "TM-Scramb" prompts redundancy scrambling to be turned on. The control circuit 40 then actuates the data generator circuit 20 using the second control signal S42. The controllable switch 25 thus connects the output of the EXOR gate 23 to the output connection A20 of the data generator circuit 20. At the same time, the control circuit 40 actuates the addressing circuit 30 using the fifth control signal S45. As described above, whenever actuated using the fifth control signal S45, at the output connection A30, the addressing circuit 30 generates the address x of one of the regular row lines R1, . . . , R10 in the first area of the memory cell array 10a. If one of the addresses x addresses a faulty row line in the first area 10a of the memory cell array, the evaluation circuit 31 generates the address xr of the redundant row line Rr replacing the faulty row line R in the second area 10b of the memory cell array, which redundant row line is associated with the address x of the faulty row line R in the memory unit 33. As a result, the sound regular row lines are activated for writing information, with a faulty row line being replaced with a redundant row line.

In this case, the data generator circuit 20 respectively determines the data item stored in the memory cells along the activated regular and redundant row lines R, Rr. As seen from FIG. 4, the data generator circuit 20 EXORs the data value currently stored in the memory cells with the respective address x or xr of the row line R or Rr connected thereto. Hence, the memory cells along the regular row lines R1, R2, R4, R5, . . . , R10 or the memory cells along the redundant row line Rr2 are used to store the respective associated address of the regular row line along which the memory cells are arranged.

In the example in FIG. 5, the row line x=3 is assumed to be faulty and has been replaced with the redundant row line xr=2. Accordingly, the memory cells SZr connected to the redundant row line xr=2 store the data item or the address 3 of the regular row line. The memory cells in the regular memory area thus respectively store an identification data item, which corresponds to the address of the row line along which the memory cells are arranged.

The control connection S40 has the control signal "TM-Reg" applied thereto. As a result, write access is made possible only to memory cells in the regular memory area. The control circuit 40 then actuates the data generator circuit 20 again using the second control signal S42. The addressing circuit 30 is actuated using the third control signal S43. Next, the addressing circuit 30 activates the regular row lines R1, . . . , R10 in the first memory area 10a in succession. In the data generator circuit 20, the addresses of the activated row lines are logically combined with the data values stored in the memory cells using the Exclusive-OR logic function. As a result, those memory cells in which the associated address of their connected row line was stored as identification data item ID 1, ID2, ID4, . . . , ID10 are again used to store the initialization data item NI with the logic data value 0. The memory cells in which a data item was stored which is different than the address of the connected row line are now used to store the address of the connected row line. The memory cells along the third row line are thus used to store the address x=3, whereas the other memory cells along the regular row lines are used to store the data item 0.

Next, an external control signal "TM-Red" and an external "TM-Ben" are applied to the control connection S40 of the control circuit 40. The external control signal "TM-Ben" then prompts the control circuit 40 to put the controllable switch 110 into the second switch position, so that the memory cell array 10 is connected to the evaluation circuit 50 for read access. The external control signal "TM-Red" permits the external addressing of memory cells in the redundant memory area. By applying appropriate addresses to the address connection A90, the regular row lines in the first memory area of the memory cell array and the redundant row lines in the second memory area of the memory cell array are successively activated for read access.

To clarify this method step, FIG. 5 shows the memory cells along the column lines S1, S2, S3. The memory cell with the address x=3 and y=2 is a faulty memory cell connected to the row line R3. Instead of the data value 3, the data value 5 is stored there, for example. When redundancy scrambling is turned on, the third row line R3 has therefore been replaced with the redundant second row line Rr2.

By applying the addresses of the regular and redundant row lines, the memory cells are read along each row line and the data stored in the memory cells are supplied to the evaluation circuit 50. The evaluation circuit 50 is designed such that its output forwards that data item stored most often in the memory cells along a row line to the input and output buffer 100. Hence, the value 3 is respectively output at the data output connection D100 when reading the row line with the address x=3 and when reading the redundant row line with the address xr=2. Since the memory cells along the regular row line with the address x=3 and along the redundant row line with the address xr=2 store the same data value 3, the regular row line with the address x=3 has been replaced with the redundant row line with the address xr=2.

Figure 6:
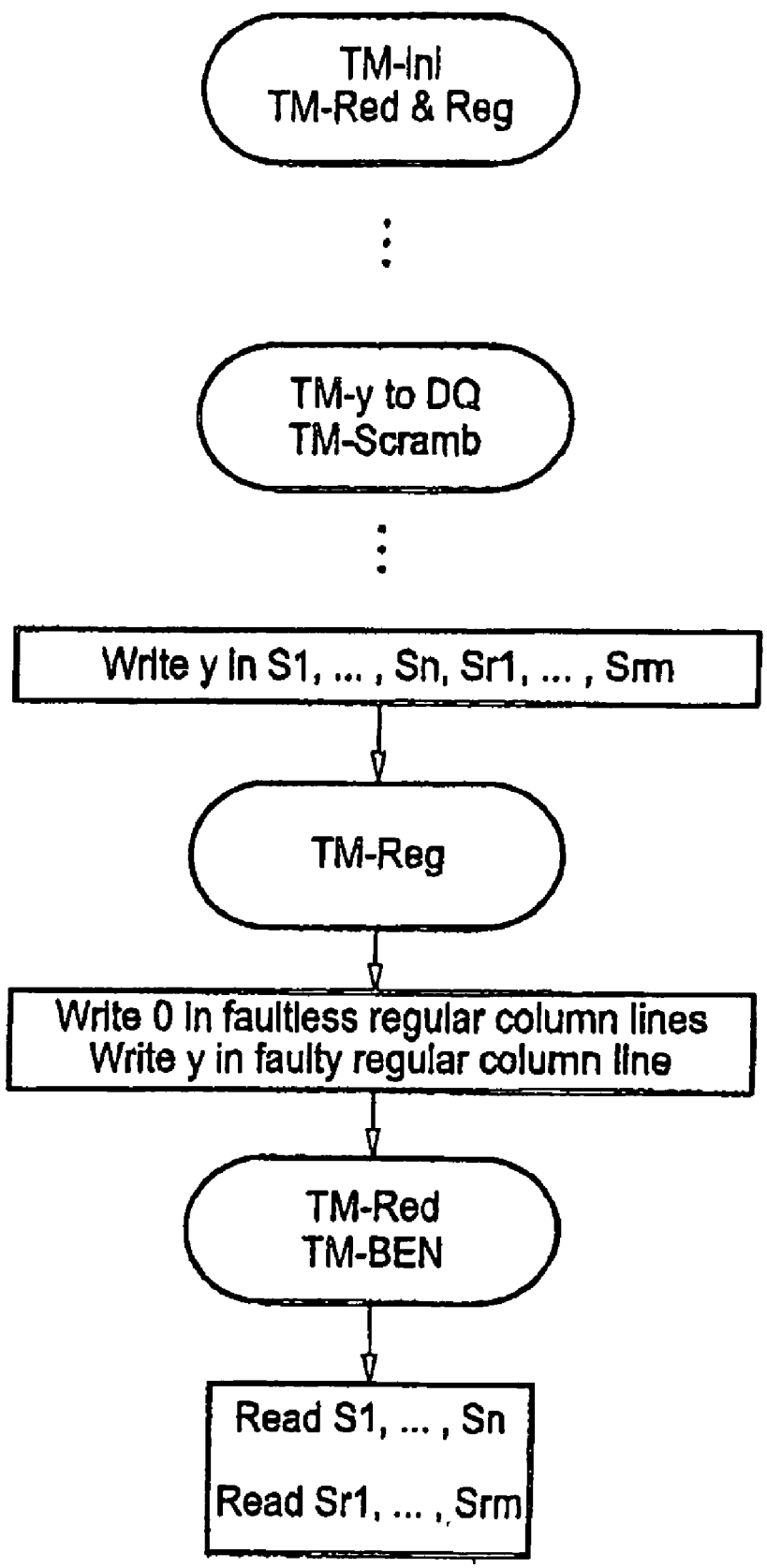
FIG. 6 shows a second embodiment of a method for ascertaining the redundancy scrambling in line with the invention.

FIG. 6 shows a signal flowchart for a method for ascertaining the redundancy scrambling in which regular faulty column lines in the first memory area have been replaced with redundant sound column lines in the second memory area. At the start of the method, the external control signal "TM-ini" and "TM-Red & Reg," which is applied to the control connection S40 of the control circuit 40, is used to initialize the memory cell array with the initialization data item.

By applying the control signal "TM-ytoDQ" and the control signal "TM-Scramb," the control circuit 40 generates the second control signal S42, which is used to actuate the data generator circuit 20, and the eighth control signal S48, which is used to actuate the addressing circuit 30. As a result, the memory cells along the column lines S1, S2, . . . , Sm, respectively, have the identification data item written to the memory cells that correspond to the associated column line address, for example. By activating the redundancy scrambling, faulty column lines in the first memory area are replaced with redundant column lines in the second memory area of the memory cell array.

Next, the control signal "TM-Reg" is applied to the control connection S40. The effect achieved by the control signal "TM-Reg" is that only memory cells along regular column lines are activated for access. The control circuit 40 then actuates the data generator circuit 20 with the second control signal S42 and the addressing circuit 30 with the sixth control signal S46. The memory cells along the regular column lines are thus successively activated for fresh write access and the initialization data item INI, i.e., the logic data value 0, for example, is written to those memory cells previously used to store the associated column line address. Memory cells arranged along a regular faulty column line are used to store the associated address, since the redundancy scrambling is turned off.

Next, the external control signal "TM-Red" and the external control signal "TM-Ben" are applied to the control connection S40. The external control signal "TM-Ben" prompts reading of the memory cells along the addressed column line via the evaluation circuit 50. The external control signal "TM-Red" permits access to memory cells in the redundant memory area from the outside by appropriate addresses being applied to the address connection A90 of the address register 90. As a result, the memory cells along the regular and redundant column lines in the first memory area 10a and the second memory area 10c can be read. The output of the evaluation circuit 50 generates the data item stored most often in the memory cells along the addressed column line. The memory cells in faulty regular column lines have an identification data item different than 0. The faulty regular column line has been replaced, in the course of the redundancy scrambling, with that redundant column line whose memory cells have been used to store the identification data item with the same value different than 0.

The method described allows analysis of the redundancy scrambling without having to open the chip or having to resort to repair data from production. Thus, it is a non-destructive analysis of the redundancy scrambling. In addition, the method allows redundancy examinations to be performed on foreign applications. To this end, the integrated memory to be analyzed remains in the application and is actuated by the control connection S40 of a memory controller using the external control signals described above, which entail a test pass as described with reference to FIG. 5, for example.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 10 memory cell array
20 data generator circuit
21, 22 memory units
23 combinational logic circuit
24 data generator
25 controllable switch
30 addressing circuit
31 evaluation circuit
32 address generator
33 memory unit
40 control circuit
50 evaluation circuit
60 output buffer
70 row decoder
80 column decoder
90 address register
B memory bank
D data item
ID identification data item
INI initialization data item
M memory module
R row line
RD read instruction
S column line
S41, . . . , S48 control signals
SZ regular memory cell
SZF memory cell array
SZR redundant memory cell
TM external control signal (test mode)
WR write instruction
x regular row address
xr redundant row address
y regular column address
yr redundant column address

What is claimed is:

1. An integrated semiconductor memory, comprising:
a memory cell array with memory cells arranged in a first and a second memory area of the memory cell array along row and column lines, the row and column lines in the first and second memory areas of the memory cell array each being addressed using an address for read and write access to the memory cells arranged along the row and column lines, a faulty row and column line in the first memory area being replaced with a row and column line in the second memory area;
an addressing circuit for addressing the row and column lines in the first and second memory areas;
a data generator circuit connected to the memory cell array for generating data, the data generated by the data generator circuit being stored in the memory cells of the memory cell array, the addressing circuit addressing one of the row and column lines in the first memory area and the second memory area, or, upon detection of one of the faulty row and column lines in the first memory area, addressing the one of the row and column lines in the second memory area replacing the one of the faulty row and column lines in the first memory area, the data generator circuit generating an initialization data item to initialize the memory cells in the first and second memory areas, the data generator circuit generating identification data to identify the row and column lines; and
an evaluation circuit connected to the memory cell array for generating an output data item, the evaluation circuit receiving data from memory cells arranged along the addressed row and column lines in the first and second memory areas, and generating the output data item with a data value stored most often in the memory cells arranged along the addressed row and column lines.

2. The integrated semiconductor memory as claimed in claim 1, further comprising:
a control circuit for generating control signals in order to control the data generator circuit and the addressing circuit.

3. The integrated semiconductor memory as claimed in claim 2, wherein, upon actuation by the control circuit using a first control signal, the data generator circuit generates the initialization data item.

4. The integrated semiconductor memory as claimed in claim 2, wherein the data generator circuit has a first input connection for applying the address of one of the row and column lines and a second input connection for applying the data stored in the memory cells, the data generator circuit generating the initialization data item with one of the data values that differs from the addresses of the row and column lines, upon actuation by the control circuit using a second control signal, the data generator circuit generating a respective identification data item from the identification data, if the address of one of the row and column lines supplied via the first input connection differs from the data value of the data stored in the memory cells supplied via the second input connection.

5. The integrated semiconductor memory as claimed in claim 4, wherein the data generator circuit generates the identification data item with one of the data values that matches the addresses of the row and column lines, upon actuation by the control circuit using the second control signal, the data generator circuit generates the initialization data item, if the address of one of the row and column lines supplied via the first input connection matches the data value of the data stored in the memory cells supplied via the second input connection.

6. The integrated semiconductor memory as claimed in claim 4, wherein the data generator circuit includes a first memory unit for storing the addresses of the row and column lines and a second memory unit for storing the data value of the data stored in the memory cells, the data generator circuit including a combinational logic circuit with a first input connection for applying the data value of the data stored in the memory cells and a second input connection for applying one of the addresses of the row and column lines, the first memory unit being connected to the first input connection of the data generator circuit, the second memory unit being connected to the second input connection of the data generator circuit, the combinational logic circuit being connected to the first memory unit by a first input connection and to the second memory unit by a second input connection.

7. The integrated semiconductor memory as claimed in claim 6, wherein the combinational logic circuit is an XOR gate.

8. The integrated semiconductor memory as claimed in claim 1, wherein the data generator circuit includes a data generator for generating the initialization data item.

9. The integrated semiconductor memory as claimed in claim 6, wherein the data generator circuit includes a controllable switch, the combinational logic circuit and the data generator are connected to the output connection of the data generator circuit by the controllable switch, upon actuation of the data generator circuit by the control circuit using the first control signal, the controllable switch in the data generator circuit connects the data generator to the output connection of the data generator circuit, and upon actuation of the data generator circuit by the control circuit using the second control signal, the controllable switch in the data generator circuit connects the combinational logic circuit to the output connection of the data generator circuit.

10. The integrated semiconductor memory as claimed in claim 2, wherein, upon actuation by the control circuit using a third control signal, the addressing circuit addresses one of the row lines in the first memory area.

11. The integrated semiconductor memory as claimed in claim 2, wherein, upon actuation by the control circuit using a fourth control signal, the addressing circuit addresses one of the row lines in the second memory area.

12. The integrated semiconductor memory as claimed in claim 2, wherein, upon actuation using a fifth control signal,
the addressing circuit addresses one of the row lines in the first memory area of the memory cell array, if the one of the row lines in the first memory area is sound, or
the addressing circuit addresses the one of the row lines in the second memory area replacing the one of the faulty row lines in the first memory area.

13. The integrated semiconductor memory as claimed in claim 2, wherein, upon actuation by the control circuit using a sixth control signal, the addressing circuit addresses the one of the column lines in the first memory area.

14. The integrated semiconductor memory as claimed in claim 2, wherein, upon actuation by the control circuit using a seventh control signal, the addressing circuit addresses the one of the column lines in the second memory area.

15. The integrated semiconductor memory as claimed in claim 2, wherein, upon actuation using an eighth control signal,
the addressing circuit addresses the one of the column lines in the first memory area, if the one of the column lines in the first memory area is sound, or
the addressing circuit addresses the one of the column lines in the second memory area replacing the one of the faulty column lines in the first memory area.

16. The integrated semiconductor memory as claimed in claim 1, wherein the addressing circuit includes an evaluation circuit, an address generator for generating the addresses of the row and column lines, and a memory unit,
the address generator and the memory unit being connected to the evaluation circuit, the memory unit storing the address of the one of the faulty row and column lines in the first memory area and the address of the one of the row and column lines replacing the one of the faulty row and column lines in the first memory area in the second memory area, the address generator generating the address of one of the row and column lines in the first memory area and the second memory area, the evaluation circuit comparing the address of one of the row and column lines in the first memory area supplied by the address generator with the address of the faulty row and column lines in the first memory area stored in the memory unit and generating the address stored in the memory unit of the row and column lines in the second memory area replacing the one of the faulty row and column lines in the first memory area.

17. A method for testing an integrated semiconductor memory with redundant memory cells, comprising:
providing an integrated semiconductor memory having memory cells arranged along row lines in a first memory area of the memory cell array and memory cells arranged along row lines in a second memory area of the memory cell array, addressing the one of the row lines in the first and second memory areas to effect read and write access to the memory cells arranged along one of the row lines, and where a faulty row line in the first memory area being replaced with a row line in the second memory area by addressing the row line in the second memory area, instead of the faulty row line in the first memory area;
addressing the row lines in the first memory area and the second memory area in succession;

writing an initialization data item to the memory cells arranged along the addressed row line in the first memory area and the second memory area;

addressing the row lines in the first memory area in succession;

writing an identification data item to the memory cells arranged along the addressed row line in the first memory area, if the addressed row line in the first memory area is sound;

addressing one of the row lines in the second memory area, if the addressed row line in the first memory area is faulty;

writing the identification data item to the memory cells arranged along the addressed row line in the second memory area;

addressing the row lines in the first memory area in succession;

writing the initialization data item to the memory cells arranged along the addressed row line in the first memory area, if the addressed row line in the first memory area is sound;

writing the identification data item to the memory cells arranged along the addressed row line in the first memory area, if the addressed row line in the first memory area is faulty;

addressing the row lines in the first memory area in succession;

reading the data stored in the memory cells arranged along the addressed row line;

outputting the data item written most often to the memory cells arranged along the addressed row line in the first memory area;

addressing the row lines in the second memory area in succession;

reading the data stored in the memory cells arranged along the addressed row line in the second memory area; and outputting the data item written most often to the memory cells arranged along the addressed row line in the second memory area.

18. A method for testing an integrated semiconductor memory with redundant memory cells, comprising:

providing an integrated semiconductor memory having memory cells arranged along column lines in a first memory area of the memory cell array and memory cells arranged along column lines in a second memory area of the memory cell array, addressing the one of the column lines in the first and second memory areas to effect read and write access to the memory cells arranged along one of the column lines, and where a faulty column line in the first memory area being replaced with a column line in the second memory area by addressing the column line in the second memory area instead of the faulty column line in the first memory area;

addressing the column lines in the first memory area and the second memory area in succession;

writing an initialization data item to the memory cells arranged along the addressed column line in the first memory area and the second memory area;

addressing the column lines in the first memory area in succession;

writing an identification data item to the memory cells arranged along the addressed column line in the first memory area, if the addressed column line in the first memory area is sound;

addressing one of the column lines in the second memory area, if the addressed column line in the first memory area is faulty;

writing the identification data item to the memory cells arranged along the addressed column line in the second memory area;

addressing the column lines in the first memory area in succession;

writing the initialization data item to the memory cells arranged along the addressed column line in the first memory area, if the addressed column line in the first memory area is sound;

writing the identification data item to the memory cells arranged along the addressed column line in the first memory area, if the addressed column line in the first memory area is faulty;

addressing the column lines in the first memory area in succession;

reading the identification data and the initialization data stored in the memory cells arranged along the addressed column line;

outputting the data item written most often to the memory cells arranged along the addressed column line in the first memory area;

addressing the column lines in the second memory area in succession;

reading the identification data and the initialization data stored in the memory cells arranged along the addressed column line in the second memory area; and outputting the data item written most often to the memory cells arranged along the addressed column line in the second memory area.

19. The integrated semiconductor memory as claimed in claim 8, wherein the data generator circuit includes a controllable switch, the combinational logic circuit and the data generator are connected to the output connection of the data generator circuit by the controllable switch, upon actuation of the data generator circuit by the control circuit using the first control signal, the controllable switch in the data generator circuit connects the data generator to the output connection of the data generator circuit, and upon actuation of the data generator circuit by the control circuit using the second control signal, the controllable switch in the data generator circuit connects the combinational logic circuit to the output connection of the data generator circuit.

20. The integrated semiconductor memory as claimed in claim 8, wherein, upon actuation by the control circuit using a third control signal, the addressing circuit addresses one of the row lines in the first memory area.

21. The integrated semiconductor memory as claimed in claim 8, wherein, upon actuation by the control circuit using a fourth control signal, the addressing circuit addresses one of the row lines in the second memory area.

22. The integrated semiconductor memory as claimed in claim 8, wherein, upon actuation using a fifth control signal, the addressing circuit addresses one of the row lines in the first memory area of the memory cell array, if the one of the row lines in the first memory area is sound, or the addressing circuit addresses the one of the row lines in the second memory area replacing the one of the faulty row lines in the first memory area.

23. The integrated semiconductor memory as claimed in claim 8, wherein, upon actuation by the control circuit using a sixth control signal, the addressing circuit addresses the one of the column lines in the first memory area.

24. The integrated semiconductor memory as claimed in claim 8, wherein, upon actuation by the control circuit using a seventh control signal, the addressing circuit addresses the one of the column lines in the second memory area.

25. The integrated semiconductor memory as claimed in claim 8, wherein, upon actuation using an eighth control signal, the addressing circuit addresses the one of the column lines in the first memory area, if the one of the column lines in the first memory area is sound, or the addressing circuit addresses the one of the column lines in the second memory area replacing the one of the faulty column lines in the first memory area.

* * * * *